United States Patent [19]

Condon

[11] 4,274,051
[45] Jun. 16, 1981

[54] ELECTROMAGNETIC ARRANGEMENT FOR MEASURING ELECTRICAL CURRENT

[75] Inventor: Joseph H. Condon, Summit, N.J.

[73] Assignee: Bell Telephone Laboratories, Incorporated, Murray Hill, N.J.

[21] Appl. No.: 61,464

[22] Filed: Jul. 27, 1979

[51] Int. Cl.³ .................... G01R 33/00; H04M 3/22
[52] U.S. Cl. ....................... 324/117 R; 179/18 FA; 361/45
[58] Field of Search ............. 324/117 R, 127, 244, 324/257, 260; 330/8; 179/18 FA; 361/45

[56] References Cited

U.S. PATENT DOCUMENTS

| | | | |
|---|---|---|---|
| 2,164,383 | 7/1939 | Burton | 330/8 |
| 3,699,442 | 10/1972 | Riley | 324/117 R |
| 4,118,597 | 10/1978 | Proctor et al. | 324/117 R |

Primary Examiner—Ernest F. Karlsen
Attorney, Agent, or Firm—Sherman N. Turner

[57] ABSTRACT

A line current measuring arrangement employs two matched toroidal cores with line windings, control windings, sense windings, and feedback windings. The line windings cause equal amounts of the same polarity of magnetizing intensity H in the two cores when a line current flows. The control windings are pulsed by control current pulses to cause equal changes of opposite polarity of control H in the two cores to drive the two cores to saturation of magnetic induction B. The sense windings are serially opposed so that the changes of B in the two cores cause sense voltages in polarity opposition. Any difference in the sense voltages, due to the presence of line current H, is cumulatively and algebraically integrated to provide a changing output voltage which is a measure of the cumulative integration. The output voltage causes feedback H in both cores in opposition to any line H. The output voltage becomes constant when the feedback H cancels the line H in both cores, whereupon the constant output voltage is a measure of any line current.

21 Claims, 2 Drawing Figures

ELECTROMAGNETIC ARRANGEMENT FOR MEASURING ELECTRICAL CURRENT

CROSS-REFERENCE TO RELATED APPLICATIONS

An improvement on the present invention is disclosed and claimed in a U.S. application Ser. No. 061,261 of J. C. Morriss for "Electromagnetic Arrangement for Measuring Electrical Current" filed on the same day as the present application.

Another improvement on the present invention is disclosed and claimed in a U.S. application Ser. No. 061,463 of J. L. Henry for "Electromagnetic Arrangement for Measuring Electrical Current" filed on the same day as the present application.

TECHNICAL FIELD

The technical field of the present invention is generally the art of measuring electrical current and particularly the art of using electromagnetic technique to do so.

BACKGROUND OF THE INVENTION

It is well known, such as in U.S. Pat. No. 4,118,597 to D. F. Proctor et al. of Oct. 3, 1978, to take advantage of the hysteresis characteristic of a magnetic structure to measure electrical line current by using that line current to magnetically adjust the structure by means of line current windings electromagnetically linking the structure so that a sensing circuit also electromagnetically linking the structure by sensing windings can detect the magnetic adjustment and can provide an electrical output which is a measure of the amplitude and polarity of the line current. Such arrangements have taken advantage of changes in permeability of the structure due to changes in line current to effect the detection. Such detection of the changes in permeability has taken the form of detecting changes in the alternating-current impedance of the sensing circuit caused by the changes in permeability.

Such arrangements as in the above prior art must contend with the fact that the sensing circuit will provide an electrical output at all times and that such output must be calibrated for all conditions of the line current, including zero line current.

SUMMARY OF THE INVENTION

The present invention uses some of the technique of the prior art but provides a measuring arrangement which produces an output only when line current is other than zero.

The above result is achieved generally by causing in the magnetic structure successive control changes of magnetizing intensity H so as to cause the magnetic induction B in the structure to undergo successive corresponding changes, the amount and polarity of which are determined by the combined amount and polarity in the structure of H due to control and of H due to any line current. Each change of B produces a corresponding voltage pulse, the amplitude and duration and polarity of which are a measure of the amount and polarity of any line H in the structure. The successive voltage pulses, if any, are subjected to cumulative algebraic integration to provide a changing output voltage according to the cumulative integration. Then, the output voltage, if any, is used to provide in the structure an amount of feedback H in opposition to any line current H so that the output voltage becomes essentially constant when the feedback H has essentially canceled the line current H and the amplitude and polarity of the constant output voltage are a measure of the line current.

In particular, B is caused to change in two ways. A first type of change of B occurs at the start of the change of control H when B changes from an amount of B corresponding to a zero amount of control H to another amount of B, the second type of change of B occurs at the end of the change of control H when B changes back to an amount of B corresponding to a zero amount of control H, and one or the other of these two types of changes of B is used to control production of the voltage pulse. Specifically, the second type of change of B is used to control production of the voltage pulse.

In more particular, the magnetic structure comprises two separate but essentially matching magnetic paths with the line current and the control current affecting both paths. The line current causes in the two paths essentially equal amounts of the same polarity of line H. The changes of control H in the two paths are essentially equal but of opposite polarity. The changes of B in the two paths are compared and any algebraic difference therebetween is used to produce the voltage pulse.

In even more particular, the first and second types of changes of B in the two-path structure are respectively increases from and decreases to an amount of B corresponding to a zero amount of control H. Specifically, B is respectively driven into saturation and then allowed to collapse.

Other features of the invention will be apparent from the subsequent detailed description and from the appended claims, including the nature and extent of various winding means linking the structure for control purposes.

BRIEF DESCRIPTION OF THE DRAWING

The drawing consists of one sheet including two figures briefly described as follows.

DETAILED DESCRIPTION

Figure 1:
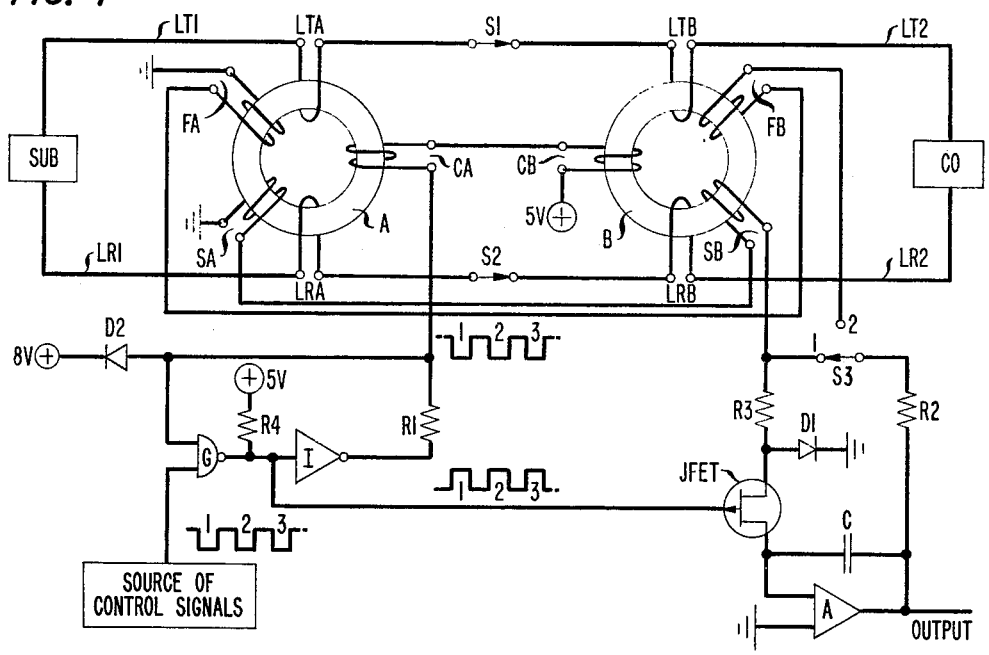
FIG. 1 is a schematic showing of an embodiment of the invention using two separate toroidal cores.

FIG. 1 shows how two magnetic cores A and B may be connected to circuitry for measuring line current. The box "SUB" represents a telephone subscriber's station equipment. The box "CO" represents a telephone switching center, such as the usual central office. The subscriber's station is connected to the central office by way of a loop comprising the lines LT1, LT2, LR1 and LR2, with line windings LTA, LTB, LRA and LRB linking the two cores A and B such that a direct current flowing in the entire loop produces in the two cores essentially equal amounts of magnetizing intensity H of the same polarity (such as clockwise in FIG. 1). The windings LTA and LRA on core A (as well as the windings LTB and LRB on core B) are so related as to aid each other in producing line H in core A due to loop current; but, these windings LTA and LTB are so related as to oppose each other in producing line H in core A due to longitudinal current, such as a current flowing either only in lines LT1 and LT2 or only in lines LR1 and LR2 or in both LT1-LT2 and LR1-LR2 but in the same direction (right to left or left to right in FIG. 1).

In FIG. 1 the two cores A and B are of essentially matching characteristics such that the slope of the hysteresis characteristic changes substantially as the magnetizing intensity H changes between a zero amount of H and a finite amount of H. Such cores may be of ferromagnetic material, such as ferrite. Cores A and B are preferably solid continuous cores of toroidal shape.

Each core has a control winding CA or CB linking the core and connected to circuitry, as will be explained, whereby a succession of control current pulses may be caused to flow in the windings CA and CB.

Each core has a sense winding SA or SB linking the core and connected to circuitry, as will be explained, whereby changes in magnetic induction B in the cores may be detected electromagnetically.

Each core has a feedback winding FA or FB linking the core and connectable to circuitry, as will be explained, whereby a feedback H may be induced in each core. With switch S3 set, as shown, on its position 1, the sense windings SA and SB are used to provide the feedback. If switch S3 were put into its position 2, as will be explained, the feedback function is performed by windings FA and FB and not by windings SA and SB.

It is to be noted that control windings CA and CB are arranged on respective cores A and B so that a control current flowing through windings CA and CB will produce essentially equal amounts of control H but of opposite polarity (that is, one clockwise and one counterclockwise in FIG. 1) in the two cores. Thus, the control H in one core will aid the line H; and, the control H in the other core will oppose the line H.

It is also to be noted that the sense windings SA and SB are arranged on respective cores A and B so that the voltages induced therein due to changes of B in the two cores are series opposed. Thus, if a change of B in core A is essentially the same as a change of B in core B, the series opposition of windings SA and SB will produce essentially zero voltage at the top of resistance R3.

In FIG. 1, the source of control signals provides a normally HIGH (H) logic level at the lower input to gate G. This H level is interrupted by a LOW (L) logic level for something like 100 nanoseconds (ns) at a 32 KHz rate so that once approximately every 31 microseconds ($\mu$s) a H-to-L-to-H pulse is provided lasting about 100 ns. The top of resistance R1 at the top input to gate G is normally (that is, between control signals) H from the +5 (positive terminal of a source of 5 volts direct current with the negative terminal assumed to be at ground potential) termination of control winding CB. With both inputs H to gate G, the output of gate G is L at the input to inverter I; and, the output of inverter I, as well as the top of resistance R1, are at H. HIGH (or H) is assumed to be essentially +5 volts; and, LOW (or L) is assumed to be essentially ground potential, such as at the terminal of sense winding SA. From the foregoing, it is apparent that control windings CA and CB have no current flowing therein at the moment.

In FIG. 1, the output of gate G appears at the control (left) of the junction field-effect transistor JFET. Since that control input to JFET is at the moment L, the JFET is in a fully conducting condition; and, the amplifier A output will be at whatever voltage represents its then stable condition. Assuming that amplifier A has not yet received any voltage pulses at its upper input, the output of amplifier A will be essentially zero, that is, essentially ground potential.

The arrangement in FIG. 1 of the amplifier A and capacitor C is a negative feedback amplifier configuration whereunder the amplifier A is prepared to sense a difference of potential across its input terminals (left) so as to produce at its output terminal (right) an opposite polarity voltage after rather high amplification, such as a mu ($\mu$) in the order of $10^5$. The arrangement is such as to acquire a charge on capacitor C representing at the output of amplifier A a voltage which is a measure of the algebraic integration of whatever difference of voltage appears at the input terminals of amplifier A. As will be seen, the output of amplifier A will be a voltage, the amplitude and polarity of which is a measure from time-to-time of the cumulative algebraic integration of whatever voltage differences appear at its input terminals.

When the source of control signals supplies one of its 100 ns H-to-L-to-H signals at the lower input to gate G, the output of gate G goes L to H. The L to H at the output of gate G turns off the JFET so that the input to amplifier A is not influenced by any voltage changes at the top of resistance R3. At the same time, the L to H at the output of gate G causes the output of inverter I to go H to L. At the time that the output of inverter I goes H to L, control current will start to build up from zero through resistance R1 and through the control windings CA and CB to the +5 source.

At the same time, the voltage at the top of resistance R1 will drop suddenly from H to L. Thereafter, the control current will gradually build up in the control windings CA and CB as the voltage at the top of resistance R1 also returns gradually toward +5 (H). After an interval, depending upon various parameters of the circuit, the control current will reach a maximum and then begin to decay. Such an interval will be in the order of 2 to 5 microseconds ($\mu$s). At that time, the voltage at the top of resistance R1 will be some small part short of the H of +5 volts. At that point, the control current in the windings CA and CB will begin to decay toward zero, causing the voltage at the top of resistance R1 to rapidly jump to a H level (such as perhaps +9.5 volts) where diode D2 conducts to allow the energy in the windings CA and CB to dissipate to the +8 volt source. Then, the voltage at the top of resistance R1 decays along with the control current until the circuit has returned to its starting condition. In the latter regard, it will be appreciated that when the voltage at the top of resistance R1 jumped from a little negative with respect to +5 volts to the +9.5 volts when diode D2 conducted, the output of gate G returned H to L and the output of inverter I returned L to H. Also, the H to L at the output of gate G caused the JFET to conduct so that the amplifier A could sense any voltage change at its output.

The foregoing has shown how a control signal from the source thereof causes a corresponding pulse of particular amplitude and duration and polarity of control current to flow in the control windings CA and CB. Also, it has been explained how each control signal turns off the JFET for the duration of the control current pulse and turns on the JFET for the remaining time.

Each pulse of control current in windings CA and CB causes a corresponding change in the cores of control H where the change of control H in each core is essentially of an equal amount and of the opposite polarity.

Also, each change of control H is such as to cause the magnetic induction B in the two cores to undergo corresponding changes of opposite polarity where the amounts and polarities of the changes of B are determined by the combined amount and polarity of line H and control H in the two cores.

Figure 2:
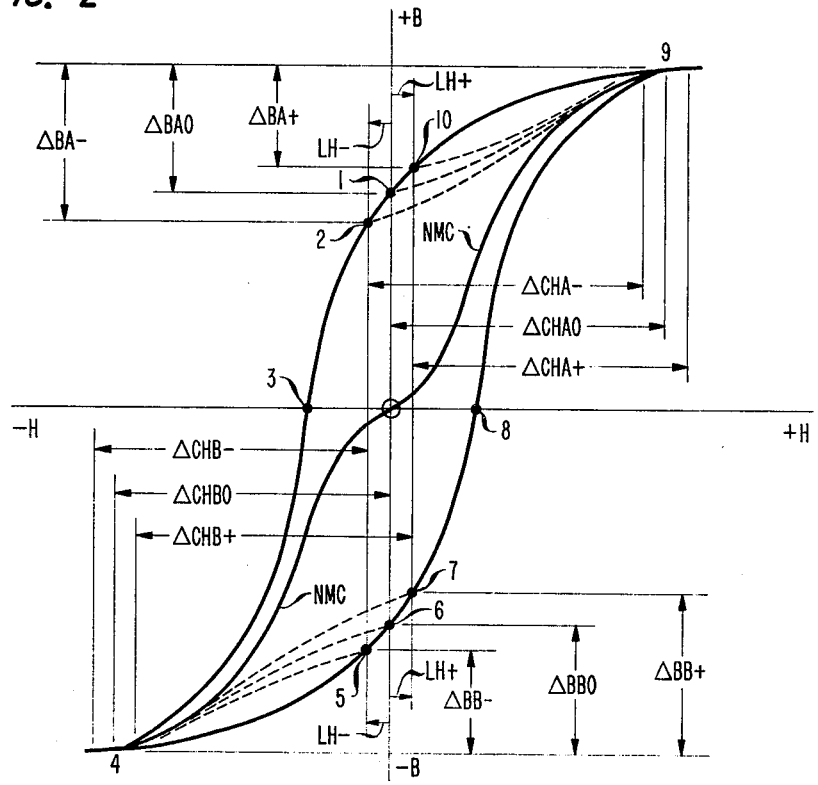
FIG. 2 is a representation of static hysteresis characteristics of the cores with notations useful in explaining the dynamic functioning thereof.

FIG. 2 is a static representation of the saturation hysteresis characteristic of the core material where the curve NMC is recognized as the normal magnetization curve and the curve from 1 through 10 is recognized as the major saturation hysteresis loop. In FIG. 2, point 1 shows where core A will rest after having been driven to saturation point 9 and then allowed to collapse, assuming no amount of magnetizing intensity H other than the change required to drive the core to saturation and to allow the core to return to an amount of B (point 1) corresponding to a zero amount of control H. In response to each pulse of control current of sufficient amplitude, duration and polarity, such as $\Delta$CHAO in FIG. 2, the B in core A will change from point 1 up the dotted line to saturation (point 9) and then decay along the curve from point 9 to point 10 to point 1 along a minor saturation hysteresis loop. This change of B, indicated at $\Delta$BAO in FIG. 2, is a measure of the combined amount and polarity of line H (zero at this time) and control H ($\Delta$CHAO at this time) in core A. At the same time, core B is undergoing a similar change in the opposite polarity sense. In FIG. 2, $\Delta$CHBO represents the change in control H in core B due to the pulse of control current and $\Delta$BBO represents the corresponding change of B in core B. In the instant situation where zero line H (that is, no line current) is assumed, $\Delta$BAO is equal and of opposite polarity to $\Delta$BBO. Thus, the sense windings SA and SB will experience the same but opposite inducements of voltage. So, since the sense windings SA and SB are arranged in series opposition, the resulting voltage at the top of resistance R3 is essentially zero.

If one assumes a certain amount of polarity of loop current, then windings LTA, LTB, LRA and LRB will cause a change in the dynamics of FIG. 2. In FIG. 2, a positive polarity of loop current is assumed to cause a positive amount LH+ of line H in each core. Thus, the changes of control H, $\Delta$CHA+ and $\Delta$CHB+ in this situation, in the two cores will cause a difference between the corresponding changes ($\Delta$BA+ and $\Delta$BB+) of B in the two cores. This difference manifests itself in a voltage of a certain amplitude and polarity at the top of resistance R3 in FIG. 1. When the JFET is allowed to turn on during the collapse of B in the cores at the end of the 2-to-5 $\mu$s control current pulse, the amplifier will be able to detect the voltage difference from sense windings SA and SB through the conducting JFET. This voltage difference is a measure of the amount and polarity of line H in the two cores and is determined by the difference between the $\Delta$BA+ and $\Delta$BB+ in FIG. 2 as these two changes of B occur from saturation to collapse (that is, from point 9 to point 10 and from point 4 to point 7).

In FIG. 1, amplifier A and capacitor C will integrate the amplitude, duration and polarity of the voltage pulse passed through the conducting JFET to produce at the output of amplifier A a considerably amplified voltage which will be retained as a charge on capacitor C. The polarity of the output voltage from amplifier A will be of opposite polarity to the voltage at the input of amplifier A.

The output of amplifier A is applied through resistance R2 and closed switch S3 to the sense windings SA and SB so as to cause in the two cores feedback H in opposition to the line H.

Over a succession of voltage pulses, caused by a succession of changes of B in the two cores, in turn caused by a succession of control current pulses, the amplifier A and capacitor C will cumulatively algebraically integrate the successive voltages so as to gradually change the output voltage of amplifier A as a changing measure of the cumulative integration. Of course, it will be appreciated that as the output voltage increases, the feedback H increases, the amplitude of the successive voltage pulses decreases, and the output voltage eventually becomes essentially constant at the point where the amount of feedback H essentially cancels the line H. This, in FIG. 2, puts the cores A and B back to the points 1 and 6 where no line H is effective. At this point, the constant output of amplifier A is a measure of the amplitude and polarity of line current which caused the process to start.

Typical parameters for the arrangement of FIG. 1 may be as follows: line windings LTA, LTB, LRA and LRB are single turn windings; control windings CA and CB have 30 turns each; sense windings SA and SB have 30 turns each; feedback windings FA and FB have 30 turns each; resistance R1 is in the range of 20 to 50 ohms; resistances R2 and R3 are 1000 ohms each; resistance R4 is 1800 ohms; capacitor C is in the range of 500 to 33,000 pf; diodes D1 and D2 will conduct on about 1.5 volts; and, the amplifier A may be any suitable negative feedback configuration having a fairly high amplification, such as a $\mu$ of $10^5$.

It will be obvious that a reversal of polarity of loop current will merely start the process at points 2 and 5 of FIG. 2 so that the amplifier A will eventually produce a constant output voltage which is a measure of that reversal.

In FIG. 1, if switch S1 were to be opened, with switch S2 closed, it will be obvious that the arrangement will measure any longitudinal current flowing in leads LR1 and LR2. Likewise, with switch S2 open and switch S1 closed, the arrangement will measure any longitudinal current flowing in leads LT1 and LT2. With both of switches S1 and S2 closed, the preferred embodiment is realized wherein loop current can be measured with any longitudinal (that is, in the same direction right to left or left to right in FIG. 1) current being nullified by the oppositely wound pairs of windings LTA-LRA and LTB-LRB.

Also, in FIG. 1, switch S3 may be moved from its position 1 to its position 2, thus to employ the separate feedback windings FA and FB to overcome the effect of the line H instead of using the sense windings SA and SB for the dual purpose of sensing and feedback.

It is to be understood that the above-described arrangement is illustrative of the application of the principles of the invention. Other arrangements may be devised by those skilled in the art without departing from the spirit and scope of the invention. For example, for a relatively large capacitor C, such as 33,000 picoforads (pf), which causes the amplifier A circuit to be relatively slow in response, alternating line current can be accurately measured where the frequency of the control signals is fairly large compared to the frequency of the line current. On the other hand, for smaller values of capacitor C, such as 500 pf, the amplifier A circuit can become relatively fast; however, the increase in quickness of response of the amplifier A circuit will be at the expense of rather large incremental steps in the output voltage, which large steps would have to be taken into account with regard to their possible harmful effects. In FIG. 1, the diode D1 is used merely to preclude any voltage change at the bottom of resistance R3 from becoming sufficiently large to inadvertently cause the JFET to conduct when such is not desired. If a JFET, or equivalent switching device, is used which does not require such protection, then diode D1 is not needed. Also, while solid toroidal cores of ferrite have been used in the preferred embodiment, it will be apparent that any reentrant magnetic path of low reluctance may be used. Futhermore, while the preferred embodiment uses minor saturation hysteresis loops, it is quite apparent that a minor hysteresis loop of any major hysteresis loop may be used as long as reasonable amounts of line current and control current are employed so that detectable differences in the changes of B result. Also, while in the preferred embodiment the collapse of the B has been used as the mechanism for deriving the voltage pulses, it will be apparent that the buildup of the B could be so used, as well as using both the buildup and the collapse, so long as the presence of line H causes a detectable difference in the changes of B in the two cores. It will also be obvious that line currents other than those in a telephone system may be measured by the use of the invention.

I claim:

1. An arrangement for measuring an electrical line current flowing in a line circuit comprising:
   (A) a magnetic structure having magnetic characteristics such that the slope of the hysteresis characteristic changes substantially as the magnetizing intensity H changes between a zero amount of H and a finite amount of H;
   (B) means electromagnetically coupling the line circuit to the structure so that a particular amplitude and polarity of line current causes in the structure a corresponding finite amount and polarity of line H;
   (C) means for supplying a succession of control signals;
   (D) a control circuit controlled by each control signal so that a corresponding pulse of particular amplitude and duration and polarity electrical control current flows in the control circuit;
   (E) means electromagnetically coupling the control circuit to the structure so that each control current pulse causes in the structure a corresponding change of control H where the change of control H is of a particular finite amount and of a particular polarity;
   (F) each change of control H being such as to cause the magnetic induction B in the structure to undergo a corresponding change the amount and polarity of which are determined by the combined amount and polarity of line H and control H;
   (G) means controlled by each control signal and by the corresponding change of B to produce a corresponding voltage pulse the amplitude and duration and polarity of which are a measure of the amount and polarity of line H in the structure;
   (H) means controlled by a plurality of successive voltage pulses
      (1) to perform cumulative algebraic integration of the successive voltage pulses
      (2) and to provide a changing output voltage the amplitude and polarity of which are a measure of the cumulative integration;
   (I) and, means controlled by the output voltage to cause in the structure an amount of feedback H where
      (1) the amount of feedback H is according to the amplitude of the output voltage
      (2) and the polarity of the feedback H is opposite to the polarity of any line H;
   (J) whereby
      (1) the amplitude of the output voltage becomes essentially constant when in the structure the amount of feedback H essentially equals the amount of line H
      (2) and the amplitude and polarity of the constant output voltage are a measure of the amplitude and polarity of the line current.

2. The invention defined in claim 1 wherein:
   (A) each change of B in the structure comprises
      (1) a first type of change occurring at the start of the corresponding control current pulse when B changes from an amount of B corresponding to a zero amount of control H to another amount of B
      (2) and a second type of change occurring at the end of the corresponding control current pulse when B changes from the said other amount of B to an amount of B corresponding to a zero amount of control H;
   (B) and, the voltage pulse producing means is controlled by the same type of change of B.

3. The invention defined in claim 2 wherein the voltage pulse producing means is controlled by only the second type of change of B.

4. The invention defined in claim 1 wherein:
   (A) the structure comprises two separate magnetic paths having essentially matching magnetic characteristics;
   (B) the line current causes in the two paths corresponding essentially equal amounts of the same polarity of line H;
   (C) each control current pulse causes in the two paths corresponding changes of control H where the changes of control H are of essentially equal amounts of the opposite polarity;
   (D) each change of control H being such as to cause the magnetic inductions B in the two paths to undergo corresponding changes of opposite polarity along minor hysteresis loops;
   (E) the voltage pulse producing means is controlled by any algebraic difference between the amounts of the corresponding changes of B in the two paths;
   (F) and, the output voltage causes essentially equal amounts of feedback H in each of the two paths;
   (G) whereby the amplitude of the output voltage becomes essentially constant when in each of the two paths the amount of feedback H essentially equals the amount of line H.

5. The invention defined in claim 4 wherein:
   (A) each change of B in each of the two paths comprises
      (1) a first type of change occurring at the start of the corresponding control current pulse when B changes from an amount of one polarity of B corresponding to a zero amount of control H to an increased amount of the same polarity of B
      (2) and a second type of change occurring at the end of the corresponding control current pulse when B changes from the said increased amount of B to a decreased amount of the same polarity of B corresponding to a zero amount of control H;

(B) and, the voltage pulse producing means is controlled by the same type of change of B.

6. The invention defined in claim 5 wherein the voltage pulse producing means is controlled by only the second type of change of B.

7. The invention defined in claim 6 wherein the minor hysteresis loops are minor saturation hysteresis loops.

8. The invention defined in claim 1 or 2 or 3 wherein:
(A) the line circuit coupling means comprises line winding means linking the structure;
(B) and, the control circuit coupling means, the voltage pulse producing means, and the feedback H causing means comprise winding means linking the structure in addition to the line winding means.

9. The invention defined in claim 8 wherein:
(A) the control circuit coupling means comprises control winding means linking the structure;
(B) and, the voltage pulse producing means and the feedback H causing means comprise winding means linking the structure in addition to the control winding means.

10. The invention defined in claim 9 wherein:
(A) the voltage pulse producing means comprises pulse producing winding means linking the structure;
(B) and, the feedback H causing means comprises feedback winding means linking the structure in addition to the pulse producing winding means.

11. The invention defined in claim 9 wherein:
(A) the voltage pulse producing means comprises pulse producing winding means linking the structure;
(B) and, the feedback H causing means comprises the said pulse producing winding means.

12. The invention defined in claim 4 or 5 or 6 or 7 wherein:
(A) the line circuit coupling means comprises line winding means linking the two paths;
(B) and, the control circuit coupling means, the voltage pulse producing means, and the feedback H causing means comprise winding means linking the two paths in addition to the line winding means.

13. The invention defined in claim 12 wherein:
(A) the control circuit coupling means comprises control winding means linking the two paths;
(B) and, the voltage pulse producing means and the feedback H causing means comprise winding means linking the two paths in addition to the control winding means.

14. The invention defined in claim 13 wherein:
(A) the voltage pulse producing means comprises pulse producing winding means linking the two paths;
(B) and, the feedback H causing means comprises feedback winding means linking the two paths in addition to the pulse producing winding means.

15. The invention defined in claim 13 wherein:
(A) the voltage pulse producing means comprises pulse producing winding means linking the two paths;
(B) and, the feedback H causing means comprises the said pulse producing winding means.

16. The invention defined in claim 15 wherein the two separate paths are two separate reentrant low-reluctance magnetic paths.

17. The invention defined in claim 16 wherein each path is a continuous solid magnetic core.

18. The invention defined in claim 17 wherein each core is of toroidal shape.

19. The invention defined in claim 14 wherein the two separate paths are two separate reentrant low-reluctance magnetic paths.

20. The invention defined in claim 19 wherein each path is a continuous solid magnetic core.

21. The invention defined in claim 20 wherein each core is of toroidal shape.

* * * * *